(12) United States Patent
Fasoli

(10) Patent No.: US 11,686,697 B2
(45) Date of Patent: Jun. 27, 2023

(54) MULTIFUNCTIONAL HETEROJUNCTION METAL OXIDE GAS SENSOR

(71) Applicant: International Business Machines Corporation, Armonk, NY (US)

(72) Inventor: Andrea Fasoli, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 371 days.

(21) Appl. No.: 17/030,675

(22) Filed: Sep. 24, 2020

(65) Prior Publication Data

US 2022/0091060 A1 Mar. 24, 2022

(51) Int. Cl.
| | |
|---|---|
| *G01N 27/12* | (2006.01) |
| *H01L 29/24* | (2006.01) |
| *G01N 27/14* | (2006.01) |
| *G01N 25/18* | (2006.01) |
| *G01N 25/48* | (2006.01) |
| *G01N 25/20* | (2006.01) |

(52) U.S. Cl.
CPC .......... *G01N 27/125* (2013.01); *G01N 25/18* (2013.01); *G01N 25/482* (2013.01); *G01N 25/4873* (2013.01); *G01N 27/12* (2013.01); *G01N 27/14* (2013.01); *H01L 29/24* (2013.01); *G01N 25/20* (2013.01); *G01N 25/48* (2013.01); *G01N 27/123* (2013.01)

(58) Field of Classification Search
CPC .... G01N 27/125; G01N 25/18; G01N 25/482; G01N 25/4873; G01N 27/12; G01N 27/14; G01N 25/20; G01N 25/48; G01N 27/123; H01L 29/24
See application file for complete search history.

(56) References Cited

U.S. PATENT DOCUMENTS

| | | |
|---|---|---|
| 5,250,170 A | 10/1993 | Yagawara et al. |
| 8,234,906 B2 | 8/2012 | Haan et al. |
| 2003/0193073 A1 | 10/2003 | Tuller et al. |
| 2006/0155486 A1 | 7/2006 | Walsh |
| 2018/0306739 A1 | 10/2018 | Dominguez et al. |

FOREIGN PATENT DOCUMENTS

| | | |
|---|---|---|
| CN | 104569061 A | 4/2015 |
| JP | 3191544 B2 | 7/2001 |
| JP | 2006184252 A | 7/2006 |

(Continued)

OTHER PUBLICATIONS

International Search Report and Written Opinion for Application #PCT/CN2021/118729, dated Dec. 17, 2021, 9 pages.

(Continued)

*Primary Examiner* — Benjamin R Schmitt
(74) *Attorney, Agent, or Firm* — Jeffrey M. Ingalls

(57) ABSTRACT

A method of identifying a gas is provided. The method includes providing a gas sensor device comprising at least two stacked metal oxide layers, wherein a change in conductance of the gas sensor device in a presence of a gas varies with a temperature of the stacked metal oxide layers. The method includes bringing the gas into proximity with the stacked metal oxide layers. The method also includes measuring the conductance of the gas sensor device when the gas is in proximity with the stacked layers at multiple temperatures to generate a temperature-conductance profile. The method also includes identifying a gas of interest based on the temperature-conductance profile.

19 Claims, 10 Drawing Sheets

(56) References Cited

FOREIGN PATENT DOCUMENTS

KR    1020180065493 A    6/2018
WO      2006068142 A1    6/2006

OTHER PUBLICATIONS

Moseley, "Progress in the development of semiconducting metal oxide gas sensors: a review" Meas. Sci. Technol. 28 (2017) 082001, Topical Review, 16 pages.
Kim et al., "Highly sensitive and selective gas sensors using p-type oxide semiconductors: Overview", Sensors and Actuators B 192 (2014), 21 pages.
Dai et al., "Highly reversible switching from P- to N-type NO2 sensing in a monolayer Fe2O3 inverse opal film and the associated P-N transition phase diagram" J. Mater. Chem A 2015, 12 pages.
Zhang et al., "A uniform porous multilayer-junction thin film for enhanced gas-sensing performance", Nanoscale 2016, DOI: 10.1039/c5nr05195a, Accepted Dec. 1, 2015, 7 pages.
Galatsis et al., "p- and n-type Fe-doped SnO2 gas sensors fabricated by the mechanochemical processing technique", Sens Act B 93, 2003, 4 pages.
Liu et al., "P-n Junction Based Gas Sensor for High Temperature Hydrocarbon Detection with Improved Selectivity", AIChE Annual Meeting 2013, Abstract Only, 3 pages.
Wisitsoraat et al., "Characterization of n-type and p-type semiconductor gas sensors based on NiOx doped TiO2 thin films", Thin Solid Films 517, 2009, 6 pages.
Kwon et al. "An array of metal oxides nanoscale hetero p-n junctions toward designable and highly-selective gas sensors", Sensors and Actuators B, 255, 2018, 8 pages.
Wu et al., "A study of transition from n- to p-type based on hexagonal WO3 nanorods sensor", Chinese Physics B, vol. 23, No. 4, 2014, 8 pages.
Woo et al., "Design of Highly Selective Gas Sensors via Physicochemical Modification of Oxide Nanowires: Overview", Sensors 2016, 23 pages.
Chi et al. "Photoluminescence and wettability control of NiFe/ZnO heterostructure bilayer films", RSC Adv., 2015, DOI: 10.1039/c5ra13973b, 9 pages.
Vuong et al., "Ni2O3-decorated SnO2 particulate films for methane gas sensors", Sens Act B, 192, 2014, 7 pages.
Lee et al., "p-type a-Fe2O3 nanowires and their n-type transition in a reductive ambient", Nano, Micro, Small, Jul. 2007, https://doi.org/10.1002/smll.200700004, 6 pages.
Gurlo et al., "An n- to p-type conductivity transition induced by oxygen adsorption on α-Fe2O3", Applied Physics Letters, vol. 85, Issue 12, Sep. 2004, 4 pages.
Gurlo et al., "A p- to n-transition on α-Fe2O3-based thick film sensors studied by conductance and work function change measurements", Sensors and Actuators B, 102, Sep. 2004, https://doi.org/10.1016/j.snb.2004.04.075, 8 pages.
Siciliano et al., "Transition from n- to p-type electrical conductivity induced by ethanol adsorption on α-tellurium dioxide nanowires", Sensors and Actuators B 138, 2009, https://doi.org/10.1016/j.snb.2009.02.007, 7 pages.
Ruhland et al., "Gas-kinetic interactions of nitrous oxides with SnO2 surfaces", Sensors and Actuators B 50, 1998, https://doi.org/10.1016/S0925-4005(98)00160-9, 10 pages.
Kim et al., "Ultrasensitive Chemiresistors Based on Electrospun TiO2 Nanofibers", Nano Lett 2006, vol. 6, No. 9, 5 pages.
Zhang et al., "Detection of NO2 down to ppb Levels Using Individual and Multiple In2O3 Nanowire Devices", Nano Lett 2004, vol. 4, No. 10, 6 pages.
Zhang et al., "Sensing properties of atmospheric plasma-sprayed WO3 coating for sub-ppm NO2 detection", Sens Act B, 144, 2010, 9 pages.
Huang et al., "Low-Temperature Growth of SnO2 Nanorod Arrays and Tunable n-p-n Sensing Response of a ZnO/SnO2 Heterojunction for Exclusive Hydrogen Sensors", Adv Funct Mater 2011, 7 pages.
Kim et al., "CuO nanowire gas sensors for air quality control in automotive cabin", Sensors and Actuators B 135, 2008, 6 pages.
Lee et al., "Temperature modulation in semiconductor gas sensing", Sensors and Actuators B 60, 1999, 8 pages.
Gramm et al., "High performance solvent vapor identification with a two sensor array using temperature cycling and pattern classification", Sensors and Actuators B 95, 2003, 8 pages.
Vergara et al., "Optimised temperature modulation of metal oxide micro-hotplate gas sensors through multilevel pseudo random sequences", Sensors and Actuators B 111-112 (2005), 10 pages.
Mell et al., "The NIST Definition of Cloud Computing", Recommendations of the National Institute of Standards and Technology, Special Publication 800-145, Sep. 2011, 7 pages.

MULTIFUNCTIONAL HETEROJUNCTION METAL OXIDE GAS SENSOR

BACKGROUND

The present disclosure relates to a multifunctional heterojunction metal oxide gas sensor, and methods of manufacturing a multifunctional heterojunction metal oxide gas sensor.

Due to their chemiresistive behavior, metal oxide semiconductor (MOX or MOS) materials have been used as gas sensing elements. $SnO_2$, an n-type MOX, is on example of a material used in commercial devices and platforms of the MOX kind, as it offers a good trade-off between sensitivity and stability (i.e., resilience to signal degradation over time). In the context of multi-sensorial gas sensing solutions (i.e., electronic noses), access to diverse, linearly independent sensor outputs is a factor that enables the identification of different volatile substances and mixtures.

SUMMARY

Certain embodiments relate to a method of identifying a gas. The method includes providing a gas sensor device comprising at least two stacked metal oxide layers, wherein a change in conductance of the gas sensor device in a presence of a gas varies with a temperature of the stacked metal oxide layers. The method includes bringing the gas into proximity with the stacked metal oxide layers. The method also includes measuring the conductance of the gas sensor device when the gas is in proximity with the stacked layers at multiple temperatures to generate a temperature-conductance profile. The method also includes identifying a gas of interest based on the temperature-conductance profile.

Certain embodiments relate to a multifunctional heterojunction metal oxide gas sensor device. The gas sensor device includes a substrate, at least two electrodes formed on the substrate, a first metal oxide layer formed on the substrate and the electrodes, and a second metal oxide layer formed on the first metal oxide layer. A change in conductance of the gas sensor device in the presence of a gas varies with a temperature of the first and second metal oxide layers.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

Figure 1:
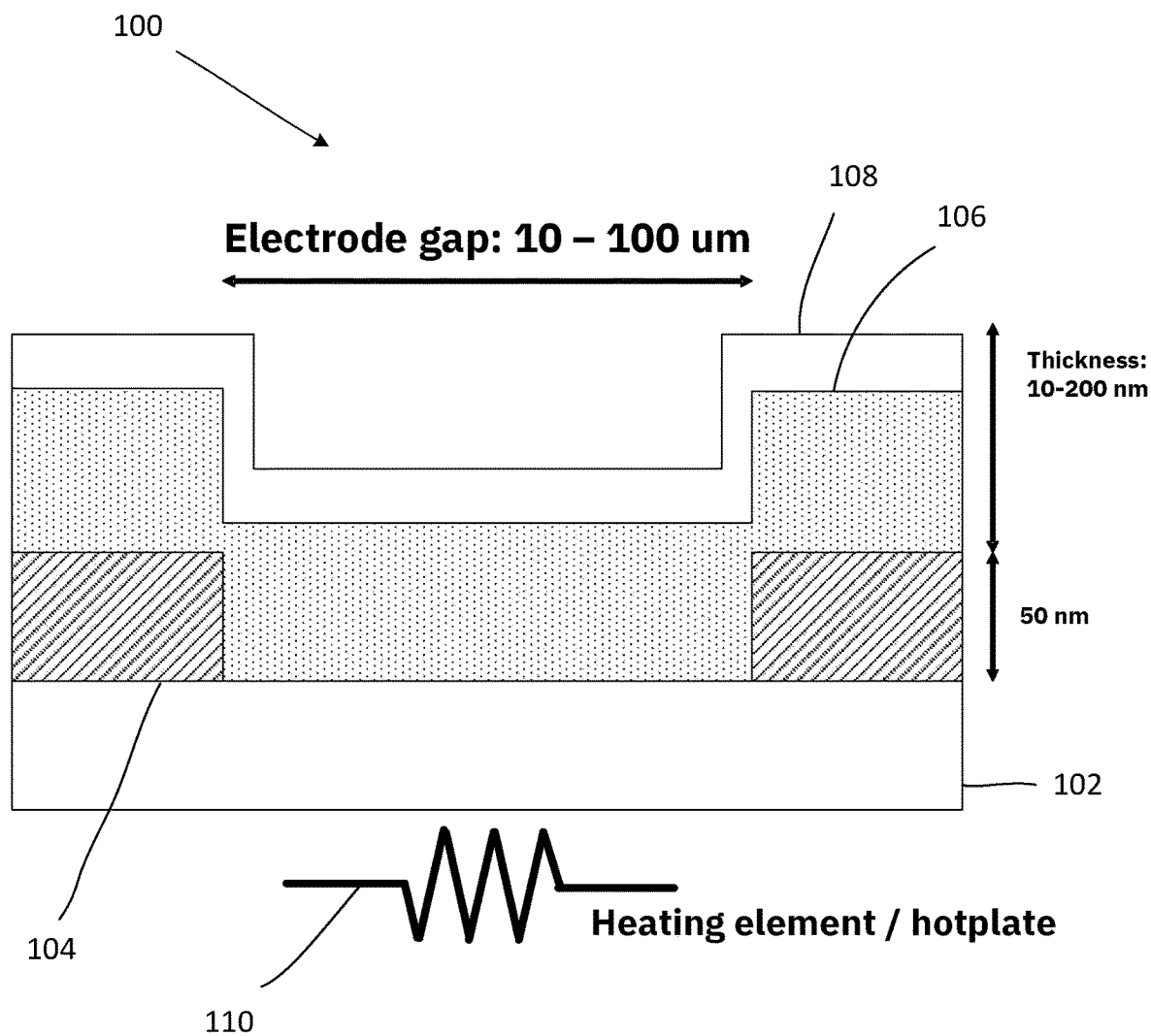
FIG. 1 is a cross-sectional view depicting a heterojunction metal oxide gas sensor device having a bilayer structure, according to embodiments.

It should be appreciated that elements in the figures are illustrated for simplicity and clarity. Well-understood elements that may be useful or necessary in a commercially feasible embodiment may not be shown for the sake of simplicity and to aid in the understanding of the illustrated embodiments.

DETAILED DESCRIPTION

The present disclosure describes multifunctional heterojunction metal oxide gas sensors and methods of manufacturing multifunctional heterojunction metal oxide gas sensors. In particular, the present disclosure describes multifunctional heterojunction metal oxide gas sensor devices that include two or more MOX thin films having different sensing properties. In one example, a first layer is an n-type $SnO_2$ layer, and a second layer is a p-type NiO layer. By varying the operational temperature, the response of this multilayer device changes from being dominated by the top layer (e.g., the p-type layer) to being dominated by the bottom layer (e.g., the n-type layer). Thus, the term multifunctional may refer to the ability of the gas sensor to have either (or both) of a p-type response characteristic or an n-type response characteristic depending on the operating temperature and/or the material compositions of the different thin films. In other embodiments, where the multiple different n-type (or p-type) layers, the response characteristics may be of either of these layers, or a combination of both of these layers. The stack effectively functions as a multiplexed sensor, where the sensing properties and diverse response to gases of each layer, or their combination, can be individually accessed on-demand by varying the operational temperature.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating, or semiconductor layers at the interface of the two elements. It should be noted, the term "selective to," such as, for example, "a first element selective to a second element," means that a first element can be etched, and the second element can act as an etch stop.

For the sake of brevity, conventional techniques related to a semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip (or gas sensor device) that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etching processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE, the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, in general, due to their chemiresistive behavior, metal oxide semiconductor (MOX or MOS) materials have been used as gas sensing elements. $SnO_2$, an n-type MOX, is one common material found in commercial devices and platforms of the MOX kind, as it exhibits an effective trade-off between sensitivity and stability (i.e., resilience to signal degradation over time).

In the context of multi-sensorial gas sensing solutions (i.e., electronic noses) access to diverse, linearly independent sensor outputs is a factor that enables the identification of different volatile substances and mixtures. Unfortunately, the dominance of $SnO_2$ across the MOX sensor market limits the range of responses one can utilize, as many available sensors consist of variations on this material. Variations of these types of $SnO_2$ sensors are achieved, for example, by varying the doping concentrations of the $SnO_2$ material, or by changing the physical configuration (i.e., decorating) of the $SnO_2$ grains. However, even with these, they are not sufficiently different from each other.

In an attempt to overcome these possible limitations, in certain embodiments, multifunctional heterojunction metal oxide gas sensors may include p-type MOX layers or combinations of n-type and p-type MOX layers. P-type MOX layers alone can provide diverse responses. However, the sensitivity may be too low. In certain embodiments, multifunctional heterojunction metal oxide gas sensors are provided with n-type layer and p-type layer combinations at the nanoscale, and these devices may exhibit some level of improvement of sensing performance. In such embodiments, the addition of the p-type MOX layer serves the role of enhancing the sensing properties of the primary sensing element (e.g., an n-type MOX layer), and the output of the n-type MOX layer is always dominant.

For certain of the present embodiments, multi-sensorial solutions are integrated into a single structure which may exhibit a diverse set of sensor responses, along with the capability of accessing these different responses in a simple way.

In general, the gas sensor device of the present embodiments includes two stacked MOX layers in contact with each other at a junction. Each MOX layer is a chemiresistive material whose resistance depends on the kind of gases it is exposed to, as well as their concentration. These MOX sensing layers are thin, granular, and porous, so that in typical conditions the gases from the environment permeate the whole structure and react with both the top and the bottom layer. In certain embodiments, the thicknesses of the different MOX layers (as well as their chemical composition) may determine the performance properties of the device. These thicknesses of the layers may also lead to unexpected and valuable sensing behaviors, as described herein.

As described in further detail below, sensor resistivity data is measured over a period of time in the presence of one or more analyte gases. Graphical examples of this measured data are shown, for example, in FIGS. 3 and 4 of the present application. These resistivity curves have certain patterns that may be identified to determine the presence of an analyte gas. In certain embodiments, an operator (or user) may manually identify the presence of the gas by reviewing the graphs. In other embodiments, artificial intelligence systems and deep learning neural networks may be utilized to determine the presence of the gas. In certain embodiments, a system is provided that is configured to perform real-time gas detection based on the resistivity data of the gas sensor device, and to discover the identity of these gases automatically (i.e., without the need for user input).

Data analytics and data science is becoming increasingly popular. With the proliferation of the Internet of Things (IoT) and sensor devices (e.g., the gas sensor device of the present embodiments), and the ever-increasing popularity of cloud computing, the quality of data collected in real-time from all the different components has become important. Certain embodiments utilize algorithms based on a combination of deep learning (e.g., Recurrent Neural Networks) and signal processing techniques to train a model, and then compare the real-time data with a prediction from the existing model to discover the presence of an analyte gas.

In the present embodiments, neural networks and other deep learning systems may be utilized to aid in gas detection for a gas sensor device. An Artificial Neural Network (ANN) (also referred to more generally as a neural network) is a computing system made up of a number of simple, highly interconnected processing elements (nodes), which process information by their dynamic state response to external inputs. ANNs are processing devices (algorithms and/or hardware) that are loosely modeled after the neuronal structure of the mammalian cerebral cortex but on much smaller scales. Such systems progressively and autonomously learn tasks by means of examples, and they have successfully been applied to, for example, speech recognition, text processing and computer vision. A large ANN might have hundreds or thousands of processor units, whereas a mammalian brain has billions of neurons with a corresponding increase in magnitude of their overall interaction and emergent behavior.

Many types of neural networks are known, starting with feedforward neural networks, such as multilayer perceptrons, deep learning neural networks (DNNs) and convolutional neural networks. A feedforward neural network is an artificial neural network (ANN) where connections between the units do not form a cycle. A deep learning neural network is an artificial neural network with multiple hidden layers of units between the input and output layers. Similar to shallow ANNs, DNNs can model complex non-linear relationships. DNN architectures, e.g., for object detection and parsing, generate compositional models where the object is expressed as a layered composition of image primitives. The extra layers enable the composition of features from lower layers, giving the potential of modeling complex data with fewer units than a similarly performing shallow network. DNNs are typically designed as feedforward networks.

In certain embodiments described herein, systems, methods and computer program products are provided that use gas sensor device data and Artificial Intelligence (AI) to facilitate gas detection. Machine learning, which is a subset of AI, utilizes algorithms to learn from data (e.g., gas sensor data) and create foresights based on this data. AI refers to the intelligence when machines, based on information, are able to make decisions, which maximize the chance of success in a given topic. More specifically, AI is able to learn from a data set to solve problems and provide relevant recommendations or determinations. AI is a subset of cognitive computing, which refers to systems that learn at scale, reason with purpose, and naturally interact with humans. Cognitive computing is a mixture of computer science and cognitive science. Cognitive computing utilizes self-teaching algorithms that use data, visual recognition, and natural language processing to solve problems and optimize processes.

Referring now to the drawings in which like numerals represent the same or similar elements and initially to FIG. 1, a cross-sectional view of an example multifunctional heterojunction metal oxide gas sensor device is shown. In this example, the gas sensor device 100 includes a substrate 102. In certain embodiments, the substrate 102 is an insulating substrate, and may serve as a base layer upon which further layers are formed. The substrate 102 may also be used for support and handling of the gas sensor device 100. A pair of electrodes 104 are formed on the substrate 102. The electrodes 104 are composed of an electrically conductive material (or combination of electrically conductive materials) and provide a pathway for current to flow through the sensing structure.

As shown in FIG. 1, two sensing layers are deposited on the insulating substrate 102 and the patterned electrodes 104. A first sensing layer is an n-type metal oxide layer 106, which is conformally deposited over the insulating substrate 102 and the electrodes 104. In certain embodiments, the n-type metal oxide layer 106 may be subjected to a CMP (or other suitable planarization process) to planarize the layer. In certain embodiments, the n-type metal oxide material may be $SnO_2$, $ZnO$, $TiO_2$, $WO_3$, $In_2O_3$, $Fe_2O_3$, $MgO$, $CaO$, $ZrO_2$, $V_2O_5$, $Nb_2O_5$, $Ta_2O_5$, $MoO_3$, $Al_2O_3$, $Ga_2O_3$, $HfO_2$, $Cr_2O_3$, or $CuO$. However, it should be appreciated that other suitable materials or combinations of materials may be used for the n-type metal oxide layer 106. Moreover, it should be appreciated that one or more of the n-type metal oxide materials listed above may also exhibit p-type conductivity depending on how they are fabricated. In certain embodiments, the n-type metal oxide layer 106 may have a high sensitivity (e.g., sub-ppm levels of the analyte gas in controlled conditions). A characteristic of n-type metal oxide materials is that the resistance of the layer drops upon exposure to a reducing analyte, as described in further detail below.

Referring again to FIG. 1, a second sensing layer that is a p-type metal oxide layer 108 is next formed over the n-type metal oxide layer 106. In certain embodiments, the p-type metal oxide material may be $NiO$, $Co_3O_4$, $Cr_2O_3$, $Mn_3O_4$, $Mn_2O_3$, $Y_2O_3$, $La_2O_3$, $CeO_2$, $PdO$, $Ag_2O$, $Bi_2O_3$, $Sb_2O_3$, $TeO_2$, $Fe_2O_3$, or $HfO_2$. However, it should be appreciated that other suitable materials or combinations of materials may be used for the p-type metal oxide layer 108. Moreover, it should be appreciated that one or more of the p-type metal oxide materials listed above may also exhibit n-type conductivity depending on how they are fabricated. In certain embodiments, the p-type metal oxide layer 108 may have a diverse selectivity (i.e., surface properties differ). In certain embodiments, the p-type metal oxide layer 108 differences in humidity may have a limited effect on the sensitivity of the gas sensor device 100. In certain embodiments, the p-type metal oxide layer 108 may have a low sensitivity (e.g., 10-100 time less sensitive than the n-type metal oxide layer 106, which may be a consequence of a conduction mechanism).

Although metal oxide layers are described with respect to the embodiment shown in FIG. 1, it should be appreciated that three or more layers may be utilized in other embodiments. In the example shown in FIG. 1, a combined film thickness of the n-type metal oxide layer 106 and the p-type metal oxide layer 108 may range from 10-200 nm. In the example shown in FIG. 1, a width of an electrode gap between the electrodes 104 may range from 10-100 um. However, it should be appreciated that other film thicknesses or electrode gap dimensions may be used. The current flow through the gas sensor device 100 (or, equivalently, the sensor resistance) depends on the environment the gas sensor device 100 is exposed to, therefore providing a means for the detection of various types of gases.

As also shown in FIG. 1, a heat source or heating element 110 is positioned beneath the insulating substrate 102. This heating element 110 is used to bring the sensing layers (i.e., the n-type metal oxide layer 106 and the p-type metal oxide layer 108) to the desired operational temperature (typically 100° C.-500° C.). Operating MOX materials at high temperatures (e.g., 100° C.-500° C.) may trigger surface reactions and promote desorption. In certain embodiments, a higher operating temperature of the MOX materials may be leveraged to achieve an increased sensitivity, minimize response and recovery time, and, in some cases, provide some level of gas discrimination.

Taken individually, each sensing layer is characterized by its own unique response pattern when exposed to a set of gases. As an example, the top layer (e.g., the p-type metal oxide layer 108) may respond strongly to gas A but not to gas B, while the bottom layer (e.g., the n-type metal oxide layer 106) may display the opposite behavior. Not only the amplitude, but also the direction of the change in resistance, may differ between the top and the bottom sensing layers. This is typically the case when comparing an n-type MOX layer to a p-type MOX layer. That is, when exposed to a reducing gas (or reducing analyte), such as $H_2$ or different complex hydrocarbons, the resistance of an n-type MOX layer will decrease, while that of a p-type MOX layer will increase.

Figure 2A:
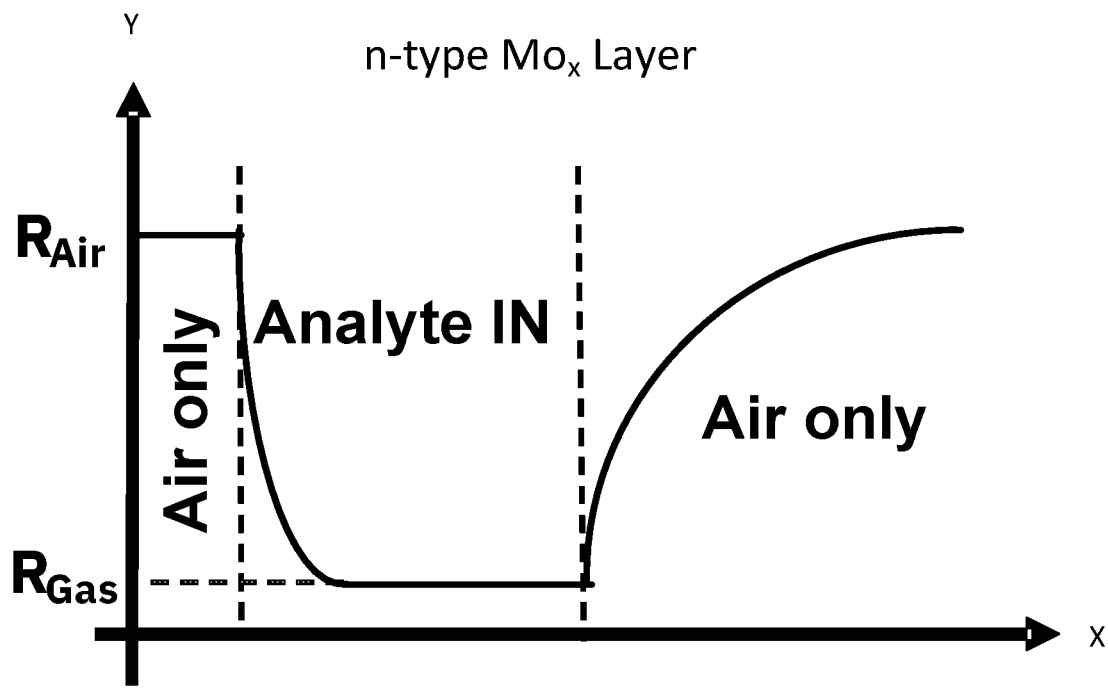
FIG. 2A is a graph illustrating a change in resistance over time of an example heterojunction metal oxide gas sensor device having an n-type metal oxide material composition, when the device is exposed to an analyte gas, according to embodiments.

Referring now to FIG. 2A, a graph showing the resistance (i.e., the y-axis of the graph) of an example of an n-type metal oxide (MOX) layer is shown in the presence of a reducing analyte (or gas) over time (i.e., the x-axis of the graph). As shown in FIG. 2A, the resistance of air only ($R_{air}$) is initially high before the analyte gas is introduced. At the point when the analyte gas is introduced, the resistance is gradually lessened from the higher $R_{air}$ level to the lower $R_{gas}$ level. When the analyte gas is removed or otherwise exhausted to the point when there is air only again, the resistance is gradually increased from the lower $R_{gas}$ level back to the higher $R_{air}$ level. Although not shown in FIG. 2A, the opposite behavior can be observed upon exposure to an oxidizing gas (as opposed to a reducing analyte or gas), such as $O_3$ (ozone): in this case, the resistance of an n-type MOX will initially increase when exposed to the oxidizing analyte gas.

Figure 2B:
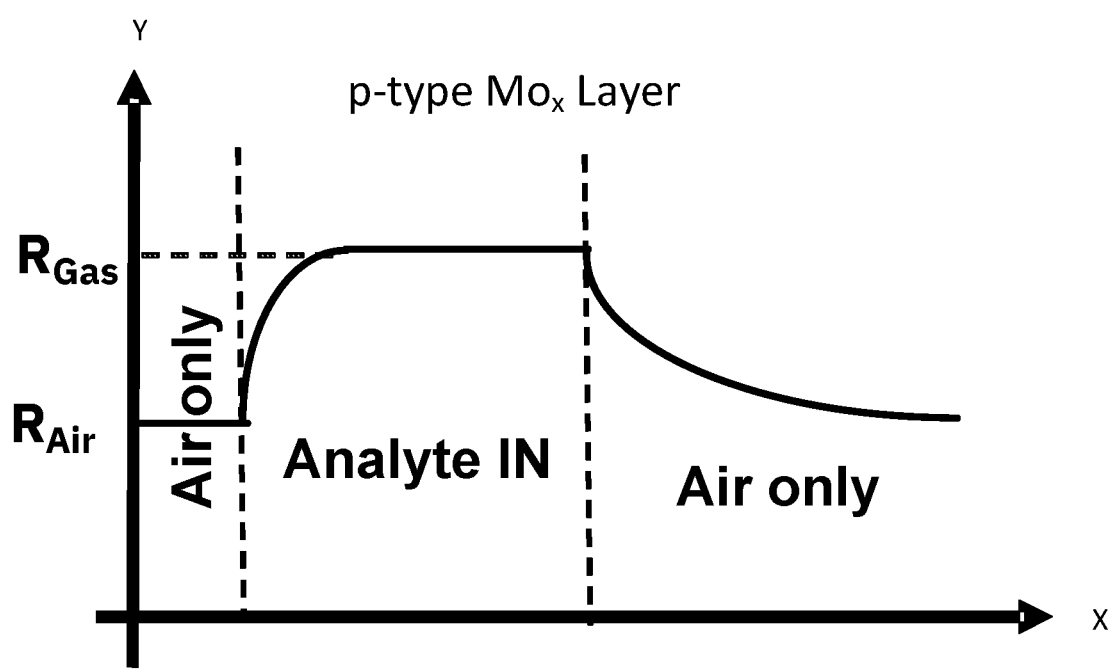
FIG. 2B is a graph illustrating a change in resistance over time of an example heterojunction metal oxide gas sensor device having an p-type metal oxide material composition, when the device is exposed to an analyte gas, according to embodiments.

Referring now to FIG. 2B, a graph showing the resistance (i.e., the y-axis of the graph) of an example of a p-type metal oxide (MOX) layer is shown in the presence of a reducing analyte (or gas) over time (i.e., the x-axis of the graph). As shown in FIG. 2B, the resistance of air only ($R_{air}$) is initially low before the analyte gas is introduced. At the point when the analyte gas is introduced, the resistance gradually increases from the lower $R_{air}$ level to the higher $R_{gas}$ level. When the analyte gas is removed or otherwise exhausted to the point when there is air only again, the resistance is gradually decreased from the higher $R_{gas}$ level back to the lower $R_{air}$ level. Although not shown in FIG. 2B, the opposite behavior can be observed upon exposure to an oxidizing gas (as opposed to a reducing analyte or gas), such as $O_3$ (ozone): in this case, the resistance of an p-type MOX will initially decrease when exposed to the oxidizing analyte gas.

It should be appreciated that the data shown in FIGS. 2A and 2B is for a single layer gas sensor device (i.e., one of either a p-type MOX layer and a n-type MOX layer) and the response and recovery timescales and profiles can greatly differ between the n-type layer and the p-type layer.

In certain embodiments, these differences in sensing response are leveraged by Machine Learning (ML) algorithms to generate models capable of discriminating different substances or mixtures, identifying volatiles, and characterizing different gaseous environments. Responses that are simply proportional to each other (i.e., linearly dependent) may not add information that can be used for gas discrimination (aside from potentially lowering measurement noise).

The multi-layer MOX gas sensor device of the present embodiments integrates into a single structure exhibiting different sensing behavior. First, by changing the operating temperature of the gas sensor device 100 (e.g., with the heating element 110 shown in FIG. 1), the whole structure may present a response that is characteristic of either of the sensing layers. In the case of two stacked layers where one is an n-type, and the other is a p-type, the observed sensing behavior can transition from dominantly n-type to dominantly p-type depending on the temperature, as explained in further detail below with respect to FIGS. 3 and 4. In addition, the geometry herein described (in which two layers of given thickness are in contact at a junction) gives rise to a third regime of operation in which the sensor response is a complex combination of each response of the individual layers. Such combination results in unique profiles of resistance (or, equivalently) current versus time, that no set of working conditions can generate with single layer gas sensor device structures. From the profiles generated by each layer individual or by their combination, valuable features can be extracted via data processing and provided to machine learning algorithms for gas detection purposes.

Figure 3:
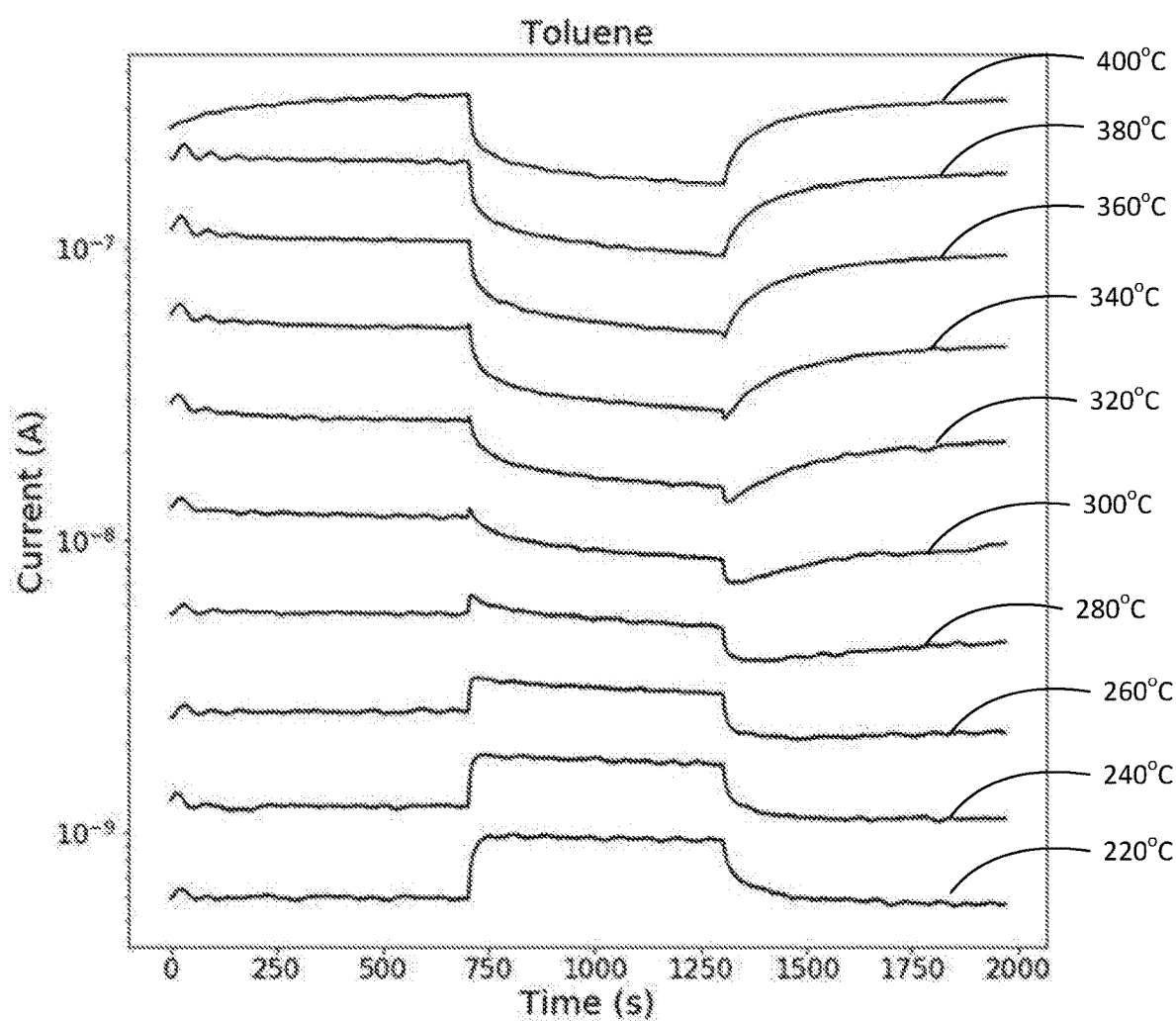
FIG. 3 is a graph illustrating changes in resistance over time of an example heterojunction metal oxide gas sensor device at different operational temperatures, according to embodiments.

Referring now to FIG. 3, a graph showing the current (i.e., the y-axis of the graph) of an example two-layer gas sensor device (e.g., the gas sensor device shown in FIG. 1) having an n-type metal oxide layer and a p-type metal oxide layer is shown in the presence of toluene over time (i.e., the x-axis of the graph). Several lines are shown in the graph that correspond to several different operating temperatures of the gas sensor device (i.e., temperatures ranging from 220° C. to 400° C. in twenty-degree increments). In particular, FIG. 3 shows the output of a heterojunction MOX gas sensor device comprising two stacked layers: a 70 nm thick $SnO_2$ bottom layer (n-type) and a 15 nm-thick NiO top layer (p-type). As the temperature is varied from low (220° C.) to high (400° C.) the baseline current (i.e., the current measured when the gas to detect is absent) progressively increases. This trend of the baseline can be often observed in a variety of single layer MOX-based sensors, as described above with respect to FIGS. 2A and 2B.

When a reducing gas of interest (200 ppb of toluene in this example) is brought into proximity of the surface of the sensor (at time ~700 sec in FIG. 3), it is detected as a change in current. At low operational temperatures (220° C.≤T≤280° C.), the current increases, as is characteristic of an n-type MOX sensor. This is indicative that the bottom layer (n-type) is dominating the response of the device. On the other hand, providing identical gas exposure while operating the device at high temperature (340° C.≤T≤400° C.) brings about a decrease in current, characteristic of p-type MOX sensors. This is indicative that in the high-temperature regime, the response is dominated by the top p-type MOX layer (i.e., rather than being dominated by the bottom n-type MOX layer).

Finally, in an intermediate range of operational temperatures, the device response is not dominated by either the n-type or p-type layers and instead is a combination of the n-type and p-type layers. As shown in FIG. 3, the response of different materials occurs over different timescales, they do not compensate each other exactly. Instead a third, distinct set of profiles is observed, where the current increases rapidly (e.g., the 300° C. curve) in the initial phase after gas exposure (time ~700 s), only to drop shortly after, down to the level or below the original baseline. The profiles in this range of temperatures do not match those of single-layer devices but are unique to the stacked layer configuration of the gas sensor device 100 of the present embodiments and can therefore provide additional information when extracted and processed by machine learning classification algorithms.

Figure 4:
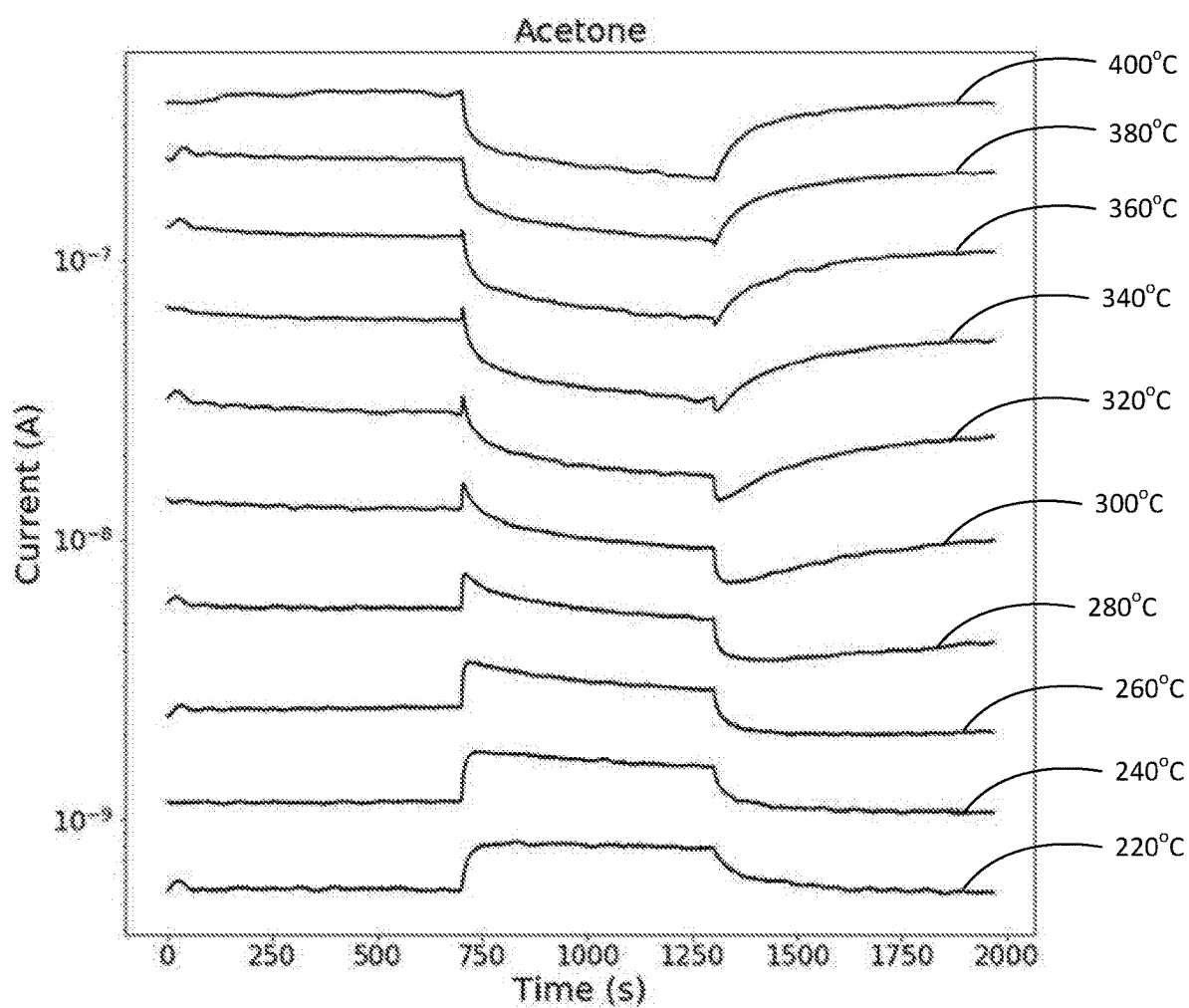
FIG. 4 is a graph illustrating changes in resistance over time of an example heterojunction metal oxide gas sensor device at different operational temperatures, according to embodiments.

Referring now to FIG. 4, a graph showing the current (i.e., the y-axis of the graph) of an example two-layer gas sensor device (e.g., the gas sensor device shown in FIG. 1) having an n-type metal oxide layer and a p-type metal oxide layer is shown in the presence of acetone over time (i.e., the x-axis of the graph). Similar to the graph of FIG. 3, several lines are shown in the graph that correspond to several different operating temperatures of the gas sensor device (i.e., temperatures ranging from 220° C. to 400° C. in twenty degree increments). In particular, FIG. 4 shows the output of a heterojunction MOX gas sensor device comprising two stacked layers: a 70 nm thick $SnO_2$ bottom layer (n-type) and a 15 nm-thick NiO top layer (p-type). As the temperature is varied from low (220° C.) to high (400° C.) the baseline current (i.e., the current measured when the gas to detect is absent) progressively increases.

When a reducing gas of interest (acetone in this example) is brought into proximity of the surface of the sensor (at time ~700 sec in FIG. 3), it is detected as a change in current. At low operational temperatures (220° C.≤T≤280° C.), the current increases, as is characteristic of an n-type MOX sensor. This is indicative that the bottom layer (n-type) is dominating the response of the device. On the other hand, providing identical gas exposure while operating the device at high temperature (340° C.≤T≤400° C.) brings about a decrease in current, characteristic of p-type MOX sensors. This is indicative that in the high temperature regime, the response is dominated by the top p-type MOX layer (i.e., rather than being dominated by the bottom n-type MOX layer).

Finally, similar to the example shown in FIG. 3 above with respect to toluene, in an intermediate range of operational temperatures, the device response shown in FIG. 4 is not dominated by either the n-type or p-type layers, and instead is a combination of the n-type and p-type layers. As shown in FIG. 4, a third, distinct set of profiles is observed, where the current increases rapidly (e.g., the 300° C. curve) in the initial phase after gas exposure (time ~700 s), only to drop shortly after, down to the level or below the original baseline. Similar to the example discussed above with respect to FIG. 3, the profiles in this range of temperatures do not match those of single-layer devices but are unique to the stacked-layer configuration of the gas sensor device 100 of the present embodiments and can therefore provide additional information when extracted and processed by machine learning classification algorithms.

It should be appreciated that FIGS. 3 and 4 show examples of one gas sensor device 100 that is exposed to two different gases at different temperatures. In these examples, the overall trend in current over time at the different temperatures may be somewhat similar. However, the shapes of the curves do exhibit certain differences that may be processed and differentiated with the aid of machine learning classification algorithms.

Figure 5:
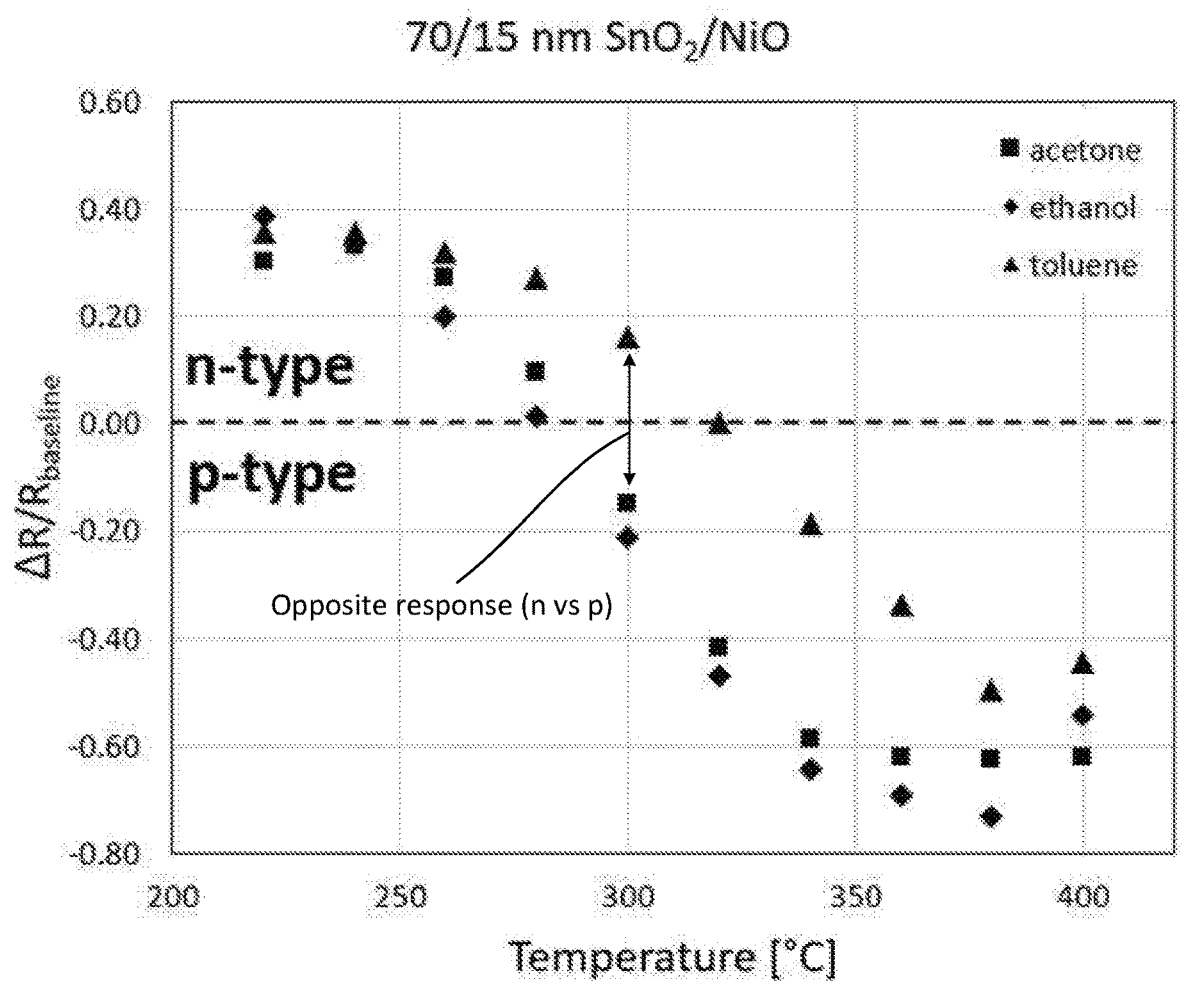
FIG. 5 is a graph illustrating changes in resistance over time of an example heterojunction metal oxide gas sensor device that is exposed to different gases, according to embodiments.

Referring now to FIG. 5, this figure shows the response of an example heterojunction MOX gas sensor device 100 (i.e., a two-layer structure including a 70 nm thick $SnO_2$ n-type layer and a 15 nm thick NiO p-type layer) when exposed to three different gases (i.e., acetone, ethanol, and toluene). In this example, temperature profiles are generated that are similar to those shown in FIG. 3. In FIG. 5, the graph shows the amplitude of the response (defined as ΔR/R, after converting the current values of FIG. 3 to resistances R). As shown in FIG. 5, the response of the same device to different gases depends not only on the temperature of operation (as shown by the changes in amplitude as a function of temperature) but also on the kind of gas being detected. Therefore, in certain examples of the present embodiments, the gas sensor device is partially selective to certain gases relative to others (i.e., the gas sensor device responds preferentially to some gases). This may allow for improved gas detection and discrimination.

Figure 6:
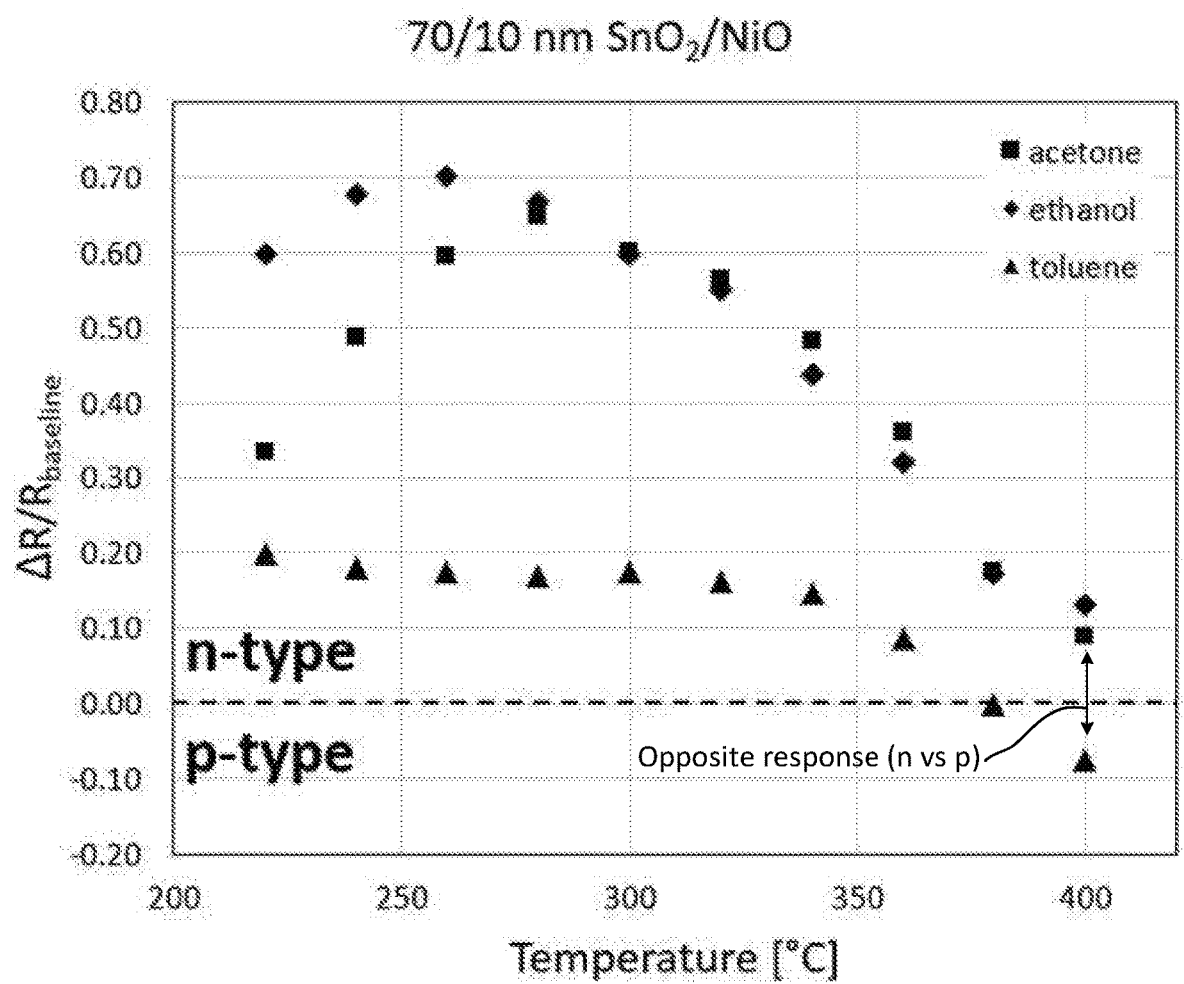
FIG. 6 is a graph illustrating changes in resistance over time of an example heterojunction metal oxide gas sensor device that is exposed to different gases, according to embodiments.

Referring now to FIG. 6, this figure shows the response to the same three gases and at the same concentrations used in FIG. 5, of a heterojunction MOX gas sensor device 100 comprising the same materials ($SnO_2$ and NiO), but with different thicknesses (i.e., a two-layer structure including a 70 nm thick $SnO_2$ n-type layer and a 10 nm thick NiO p-type layer) compared to the device of FIG. 5. The behaviors of the two devices (i.e., with devices having different thicknesses of the layers) are remarkably different. This finding highlights the importance of controlling the thickness of the device layers within an appropriate range to trigger the emergence of the sensing behavior herein described (n-type to p-type transition of response). This may also expand the range of patterns that may be generated by a multisensorial gas solution by fabricating devices of different thickness and or/materials.

The present embodiments may be applied to different combinations of n-type (e.g., $SnO_2$, $In_2O_3$, $WO_3$, ZnO, MgO, $TiO_2$, . . . ) and p-type (e.g., NiO, $Co_3O_4$, PdO, $Ag_2O$, . . . ) MOX materials. Each of such combinations may give rise to a different set of response profiles (n-type dominated, p-type dominated, or a combination of n-type and p-type). Therefore, the present embodiments may allow for a wide variety of gas sensors with ideal properties for integration in multisensorial platforms for gas identification.

It should be appreciated that the gas sensing concept is not limited to the p-n two-layer combinations described thus far. In certain embodiments, n-n or p-p heterojunctions (i.e., different MOX materials whose electrical transport properties rely on the same majority carriers) may also be capable of providing profiles characteristic of each individual layer or their combination.

It should also be appreciated that the embodiments are not limited to a two-layer gas sensor device structure. In other embodiments, three or more MOX layers may be used. That is, these embodiments having a greater number of layers may generalize the multiplexing effect (i.e., the capability of selecting a response characteristic of a chosen layer in the stack) to multilayers (N>2), where different temperatures may be used to "activate" each layer and access its sensing properties.

The embodiments of multilayer gas sensor devices described herein may allow for the implementation of an advantageous gas sensing method. By incorporating diverse response patterns in a single device (such patterns being accessible by simply varying the operational temperature), it may allow for improving the selectivity in gas detection while enabling improved manufacturing processes, lower power consumption, and smaller footprint. The flexibility of this device concept may enable a wide variety of sensor responses, which would arise from different combinations of MOX materials, different thicknesses of the respective MOX layers, and different numbers of layers.

Figure 7:
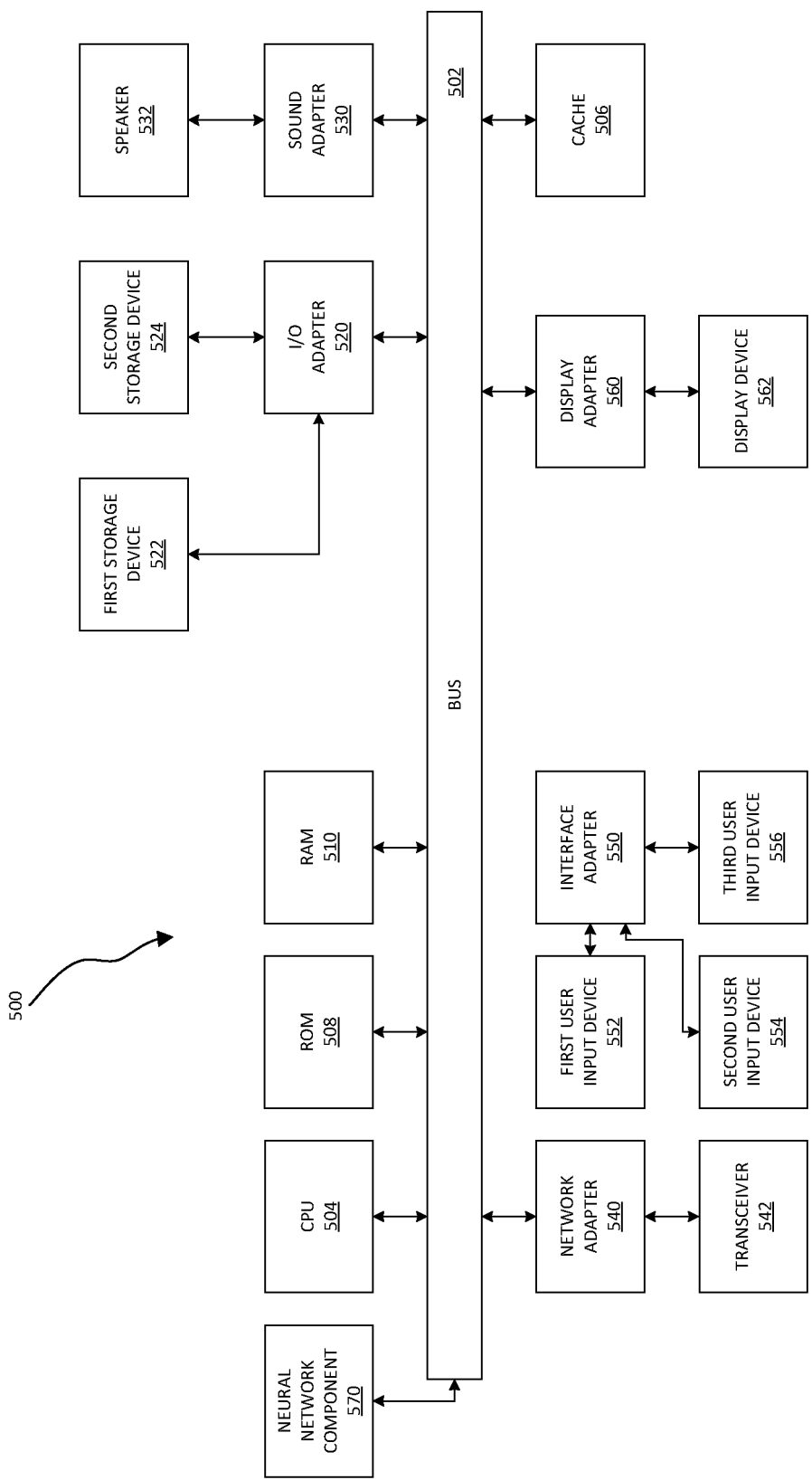
FIG. 7 is a block diagram of a processing system, according to embodiments.

Referring now to FIG. 7, an exemplary processing system 500 to which the present embodiments may be applied is shown in accordance with one embodiment. The processing system 500 includes at least one processor (CPU) 504 operatively coupled to other components via a system bus 502. A cache 506, a Read Only Memory (ROM) 508, a Random-Access Memory (RAM) 510, an input/output (I/O) adapter 520, a sound adapter 530, a network adapter 540, a user interface adapter 550, and a display adapter 560, are operatively coupled to the system bus 502.

A first storage device 522 and a second storage device 524 are operatively coupled to system bus 502 by the I/O adapter 520. The storage devices 522 and 524 may be any of a disk storage device (e.g., a magnetic or optical disk storage device), a solid-state magnetic device, and so forth. The storage devices 522 and 524 may be the same type of storage device or different types of storage devices.

A speaker 532 is operatively coupled to system bus 502 by the sound adapter 530. A transceiver 542 is operatively coupled to system bus 502 by network adapter 540. A display device 562 is operatively coupled to system bus 502 by display adapter 560.

A first user input device 552, a second user input device 554, and a third user input device 556 are operatively coupled to system bus 502 by user interface adapter 550. The user input devices 552, 554, and 556 may be any of a keyboard, a mouse, a keypad, an image capture device, a motion sensing device, a microphone, a device incorporating the functionality of at least two of the preceding devices, or any other suitable types of input devices. The user input devices 552, 554, and 556 may be the same type of user input device or different types of user input devices. The user input devices 552, 554, and 556 are used to input and output information to and from system 500. In certain embodiments, neural network component 590 with the ability to identify shapes and pattern in the gas sensor response output is operatively coupled to system bus 502. That is, AI or other deep learning systems may be used as the neural network component 590 to learn the shapes and patterns of the gas sensor output in order to identify one or more gases.

The processing system 500 may also include other elements (not shown), as readily contemplated by one of skill in the art, as well as omit certain elements. For example, various other input devices and/or output devices may be included in processing system 500, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 500 are readily contemplated by one of ordinary skill in the art given the teachings of the present disclosure provided herein.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 8:
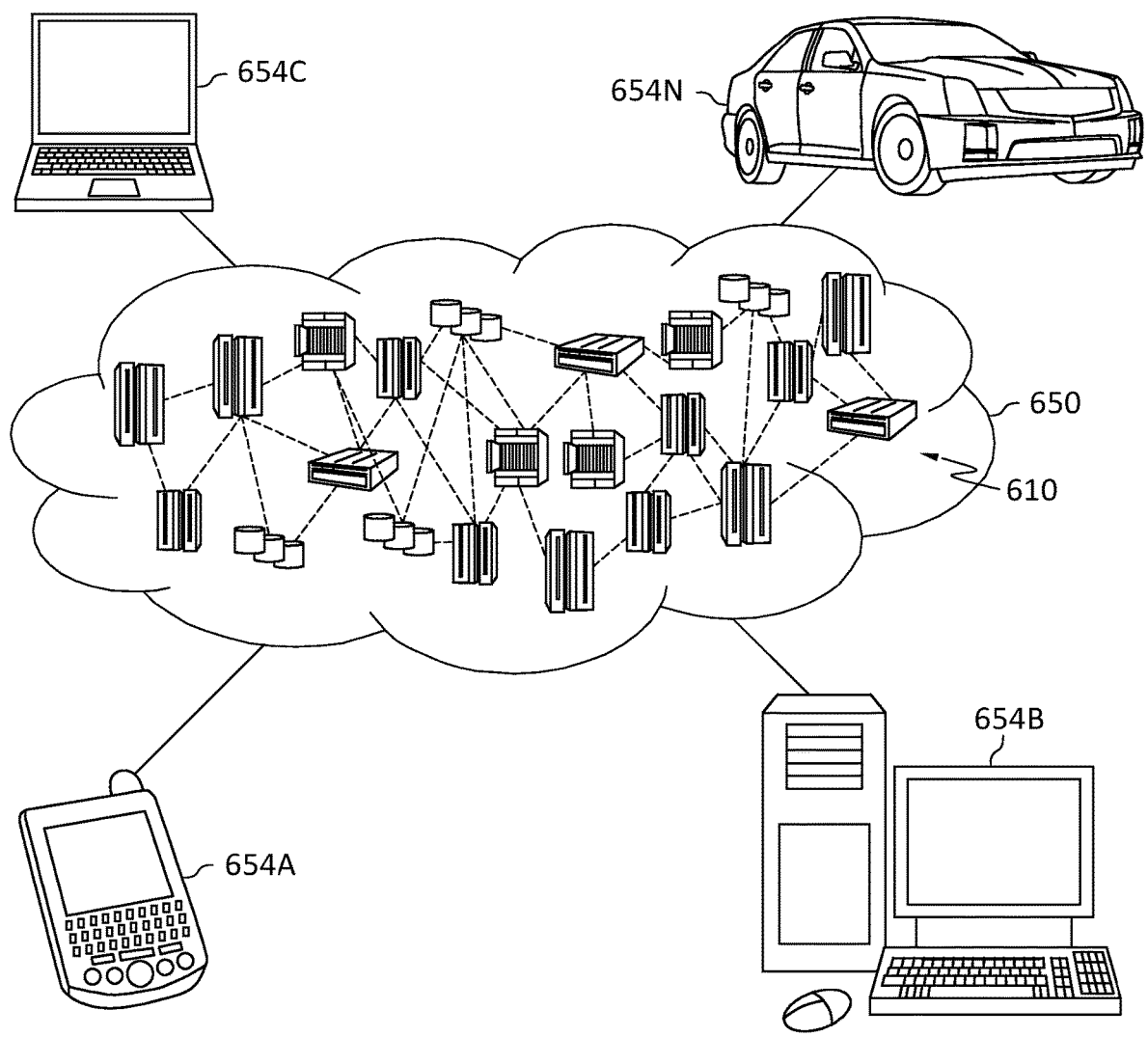
FIG. 8 is a block diagram of an illustrative cloud computing environment having one or more computing nodes with which local computing devices used by cloud customers to communicate, according to embodiments.

Referring now to FIG. 8, illustrative cloud computing environment 650 is depicted. As shown, cloud computing environment 650 includes one or more cloud computing nodes 610 with which local computing devices used by cloud consumers, such as, for example, personal digital assistant (PDA) or cellular telephone 654A, desktop computer 654B, laptop computer 654C, and/or automobile computer system 654N may communicate. Nodes 610 may communicate with one another. They may be grouped (not shown) physically or virtually, in one or more networks, such as Private, Community, Public, or Hybrid clouds as described hereinabove, or a combination thereof. This allows cloud computing environment 650 to offer infrastructure, platforms and/or software as services for which a cloud consumer does not need to maintain resources on a local computing device. It is understood that the types of computing devices 654A-N shown in FIG. 6 are intended to be illustrative only and that computing nodes 610 and cloud computing environment 650 can communicate with any type of computerized device over any type of network and/or network addressable connection (e.g., using a web browser).

Figure 9:
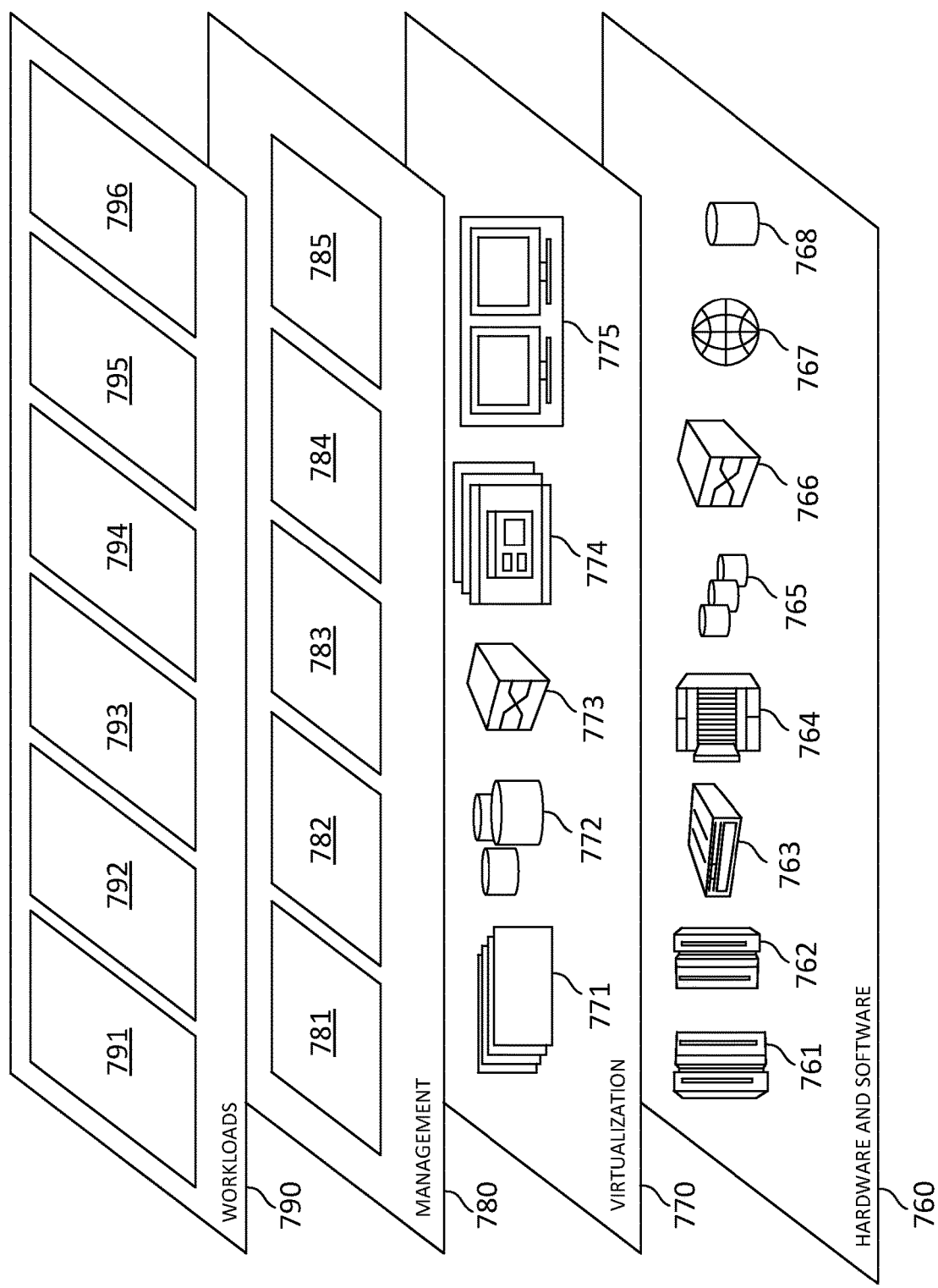
FIG. 9 is a block diagram of a set of functional abstraction layers provided by a cloud computing environment, according to embodiments.

Referring now to FIG. 9, a set of functional abstraction layers provided by cloud computing environment 650 (FIG. 8) is shown. It should be understood in advance that the components, layers, and functions shown in FIG. 9 are intended to be illustrative only and embodiments of the invention are not limited thereto. As depicted, the following layers and corresponding functions are provided:

Hardware and software layer 760 includes hardware and software components. Examples of hardware components include: mainframes 761; RISC (Reduced Instruction Set Computer) architecture-based servers 762; servers 763; blade servers 764; storage devices 765; and networks and networking components 766. In some embodiments, software components include network application server software 767 and database software 768.

Virtualization layer 770 provides an abstraction layer from which the following examples of virtual entities may be provided: virtual servers 771; virtual storage 772; virtual networks 773, including virtual private networks; virtual applications and operating systems 774; and virtual clients 775.

In one example, management layer 780 may provide the functions described below. Resource provisioning 781 provides dynamic procurement of computing resources and other resources that are utilized to perform tasks within the cloud computing environment. Metering and Pricing 782 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 783 provides access to the cloud computing environment for consumers and system administrators. Service level management 784 provides cloud computing resource allocation and management such that required service levels are met. Service Level Agreement (SLA) planning and fulfillment 785 provide pre-arrangement for, and procurement of, cloud computing resources for which a future requirement is anticipated in accordance with an SLA.

Workloads layer 790 provides examples of functionality for which the cloud computing environment may be utilized. Examples of workloads and functions which may be provided from this layer include: mapping and navigation 791; software development and lifecycle management 792; virtual classroom education delivery 793; data analytics processing 794; transaction processing 795; and neural network gas detection processing 796.

Figure 10:
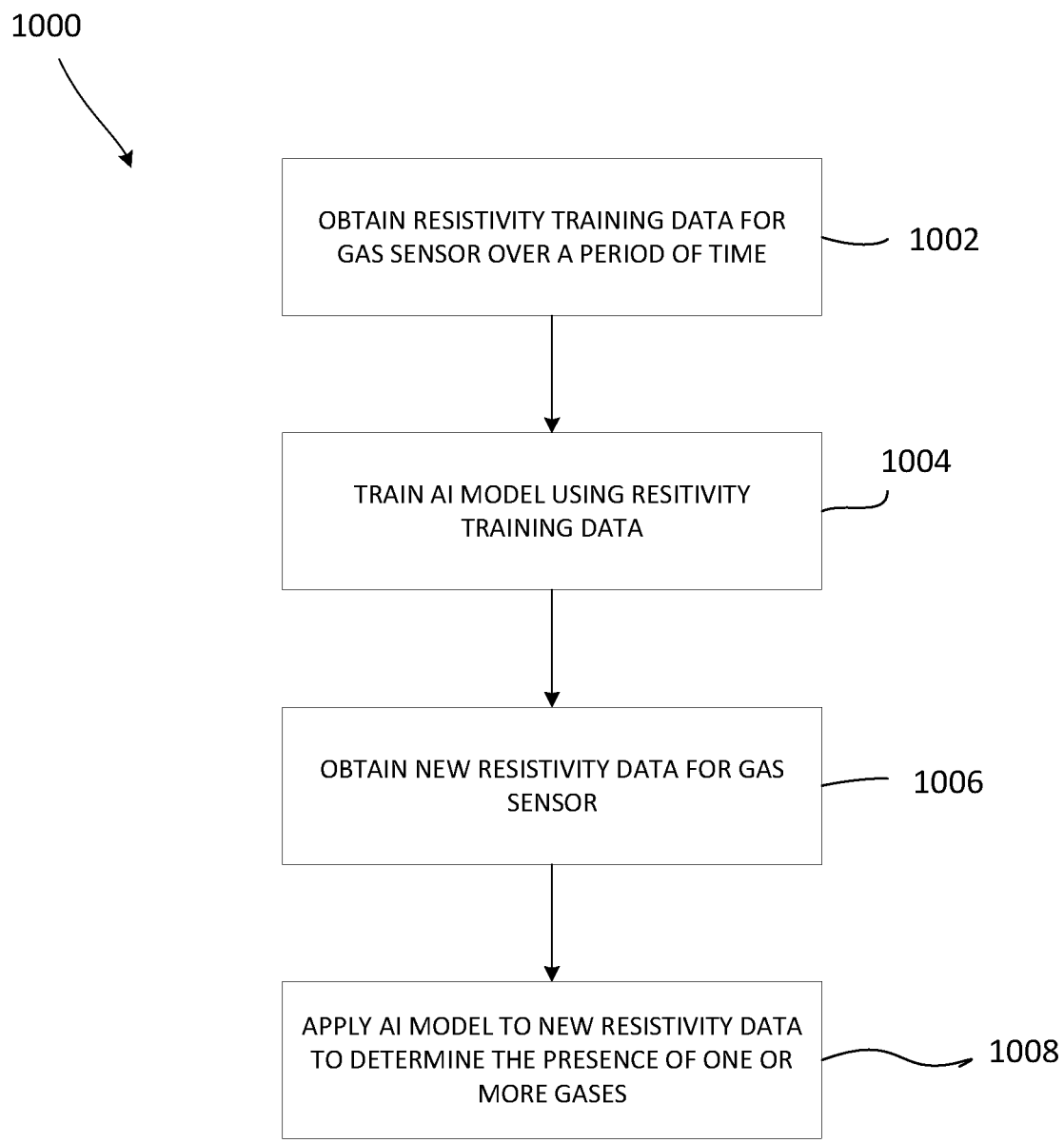
FIG. 10 is a flow chart illustration the process of training an artificial intelligence (AI) model, and the application of the AI model to gas sensor data.

Referring now to FIG. 10, this figure is a flowchart that shows a process 1000 of training an artificial intelligence (AI) model, and the application of the AI model to gas sensor data. At operation 1002, resistivity training data is obtained for a gas sensor device (e.g., the gas sensor device 100 of FIG. 1). This may be data for any gas (or combination of gases) at a variety of different temperatures. Other factors that may be included in the training model are the thicknesses of the different layers of the MOX thin films of the gas sensor, and the material composition of the each of the MOX thin films. At operation 1004, a deep learning artificial intelligence (AI) system (e.g., the neural network component 570 shown in FIG. 7) may be used to train one or more AI models using the resistivity training data of the gas sensor(s). Once the AI models have been trained at operation 1004, new resistivity data is obtained for the gas sensor at operation 1006. At operation 1008, the trained AI model is applied to the new resistivity data to determine the presence of one or more gases. As discussed above, these resistivity curves based on the gas sensor data may have certain patterns that may be identified to determine the presence of one or more analyte gases. In certain embodiments, AI systems and deep learning neural networks may be utilized to determine the presence of the gas. In certain embodiments, a system is provided that is configured to perform real-time gas detection at operation 1008 based on the resistivity data of the gas sensor device, and to discover the identity of these gases automatically (i.e., without the need for user input).

The present embodiments may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of identifying a gas, the method comprising:
   providing a gas sensor device comprising two stacked metal oxide layers having different material compositions, wherein a change in conductance of the gas sensor device in a presence of a gas varies with a temperature of the metal oxide layers;
   bringing the gas into proximity with the metal oxide layers;
   measuring the conductance of the gas sensor device when the gas is in proximity with the metal oxide layers at multiple temperatures to generate a temperature-conductance profile; and
   identifying a gas of interest based on the temperature-conductance profile,
   wherein (i) over a first portion of a temperature range, the gas sensor device conductance is characteristic of a first one of the metal oxide layers when used alone, and
   wherein (ii) over a second portion of the temperature range that is different from the first portion of the temperature range, the gas sensor device conductance is characteristic of a second one of the metal oxide layers when used alone.

2. The method of claim 1, wherein the first one of the metal oxide layers is a p-type layer and the second one of the metal oxide layers is an n-type layer.

3. The method of claim 2, wherein a thickness of the p-type layer is less than a thickness of the n-type layer.

4. The method of claim 1, wherein the temperature-conductance profile depends on thicknesses of the metal oxide layers, and wherein the temperature-conductance profile is determined prior to identifying the gas of interest for certain thicknesses of the metal oxide layers.

5. The method of claim 1, wherein the temperature-conductance profile is generated in a temperature range from 100° C. to 500° C.

6. The method of claim 1, wherein over a third portion of the temperature range that is between the first portion of the temperature range and the second portion of the temperature range, the device conductance is characteristic of both of the first one of the metal oxide layers and the second one of the metal oxide layers.

7. The method of claim 1, wherein
   the first one of the metal oxide layers is an n-type metal oxide layer, and
   the second one of the stacked layers is a p-type metal oxide layer.

8. The method of claim 1, wherein the gas sensor device comprises at least three stacked metal oxide layers.

9. The method of claim 1, wherein:
   the first one of the metal oxide layers is a p-type layer and the second one of the metal oxide layers is a different p-type layer; or
   the first one of the metal oxide layers is an n-type layer and the second one of the metal oxide layers is a different n-type layer.

10. A gas sensor device comprising:
    a substrate;
    at least two electrodes formed on the substrate;
    a first metal oxide layer formed on the substrate and the electrodes; and
    a second metal oxide layer formed on the first metal oxide layer, the first metal oxide layer having a different material composition than the second metal oxide layer,
    wherein a change in conductance of the gas sensor device in a presence of a gas varies with a temperature of the first and second metal oxide layers,
    wherein (i) over a first portion of a temperature range, the gas sensor device conductance is characteristic of the first metal oxide layer when used alone, and
    wherein (ii) over a second portion of the temperature range that is different from the first portion of the temperature range, the gas sensor device conductance is characteristic of the second metal oxide layers when used alone.

11. The gas sensor device of claim 10, wherein the first metal oxide layer is a p-type layer and the second metal oxide layer is an n-type layer.

12. The gas sensor device of claim 11, wherein a thickness of the p-type layer is less than a thickness of the n-type layer.

13. The gas sensor device of claim 10, wherein the first metal oxide layer includes at least one selected from the group consisting of $NiO$, $Co_3O_4$, $PdO$, and $Ag_2O$.

14. The gas sensor device of claim 10, wherein the second metal oxide layer includes at least one selected from the group consisting of $SnO_2$, $In_2O_3$, $WO_3$, $ZnO$, $MgO$, and $TiO_2$.

15. The gas sensor device of claim 10, wherein a combined film thickness of the first metal oxide layer and the second metal oxide layer ranges from 10-200 nm.

16. The gas sensor device of claim 10, further comprising a heating element positioned adjacent to the substrate.

17. The gas sensor device of claim 10, wherein the gas sensor device comprises at least three stacked metal oxide layers.

18. The gas sensor device of claim 10, wherein the first metal oxide layer is a p-type layer and the second metal oxide layer is a different p-type layer.

19. The gas sensor device of claim 10, wherein the first metal oxide layer is an n-type layer and the second metal oxide layer is a different n-type layer.

* * * * *